(12) United States Patent
Choi et al.

(10) Patent No.: US 8,427,712 B2
(45) Date of Patent: Apr. 23, 2013

(54) EXPOSURE APPARATUSES AND METHODS TO COMPRESS EXPOSURE DATA

(75) Inventors: Ho Seok Choi, Suwon-si (KR); Sang Don Jang, Ansan-si (KR); Dong Seok Baek, Suwon-si (KR); Sang Geun Park, Suwon-si (KR); Myung Ho Kim, Seongnam-si (KR); Duke Kimm, Suwon-si (KR); Jung Hyeon Kim, Hwaseong-si (KR); Sang-il Hong, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 641 days.

(21) Appl. No.: 12/588,829

(22) Filed: Oct. 29, 2009

(65) Prior Publication Data

US 2010/0110214 A1  May 6, 2010

(30) Foreign Application Priority Data

Nov. 6, 2008  (KR) .................. 10-2008-0109624

(51) Int. Cl.
  *H04N 1/00*  (2006.01)
(52) U.S. Cl.
  USPC . 358/426.11; 358/474; 358/539; 358/426.02; 375/204.25; 348/222.1
(58) Field of Classification Search .......... 358/474, 358/1.9, 1.8, 426.01, 539, 540; 348/222.01, 348/E05.031, 362; 375/204.25, E07.027
  See application file for complete search history.

(56) References Cited

U.S. PATENT DOCUMENTS

| | | | | |
|---|---|---|---|---|
| 5,175,435 | A * | 12/1992 | Sakamoto et al. | 250/492.2 |
| 5,701,773 | A * | 12/1997 | Markisello | 70/465 |
| 5,767,983 | A * | 6/1998 | Terashita | 358/302 |
| 5,863,682 | A * | 1/1999 | Abe et al. | 430/30 |
| 6,204,881 | B1 * | 3/2001 | Ikeda et al. | 348/362 |
| 6,225,025 | B1 * | 5/2001 | Hoshino | 430/296 |
| 6,873,400 | B2 * | 3/2005 | Murakami et al. | 355/53 |
| 7,075,651 | B2 * | 7/2006 | Tsukakoshi | 356/399 |
| 7,264,909 | B2 * | 9/2007 | Nakasugi | 430/30 |
| 8,035,853 | B2 * | 10/2011 | Sambongi et al. | 358/1.9 |
| 8,119,312 | B2 * | 2/2012 | Murata | 430/30 |
| 8,189,171 | B2 * | 5/2012 | Kinjo et al. | 355/55 |
| 2009/0103630 | A1 * | 4/2009 | Fuchikami et al. | 375/240.25 |
| 2009/0201482 | A1 * | 8/2009 | Ozaki et al. | 355/71 |

\* cited by examiner

*Primary Examiner* — Negussie Worku

(74) *Attorney, Agent, or Firm* — Harness, Dickey & Pierce P.L.C.

(57) ABSTRACT

A method to compress exposure data may include converting image data into a plurality of exposure data, generating new exposure data by combining part of the plurality of exposure data or by excluding part of the plurality of exposure data, and compressing the new exposure data. An exposure apparatus may include a conversion unit that converts image data into a plurality of exposure data, a control unit that generates new exposure data by combining part of the plurality of exposure data or by excluding part of the plurality of exposure data, and a compression unit that compresses the new exposure data.

20 Claims, 16 Drawing Sheets

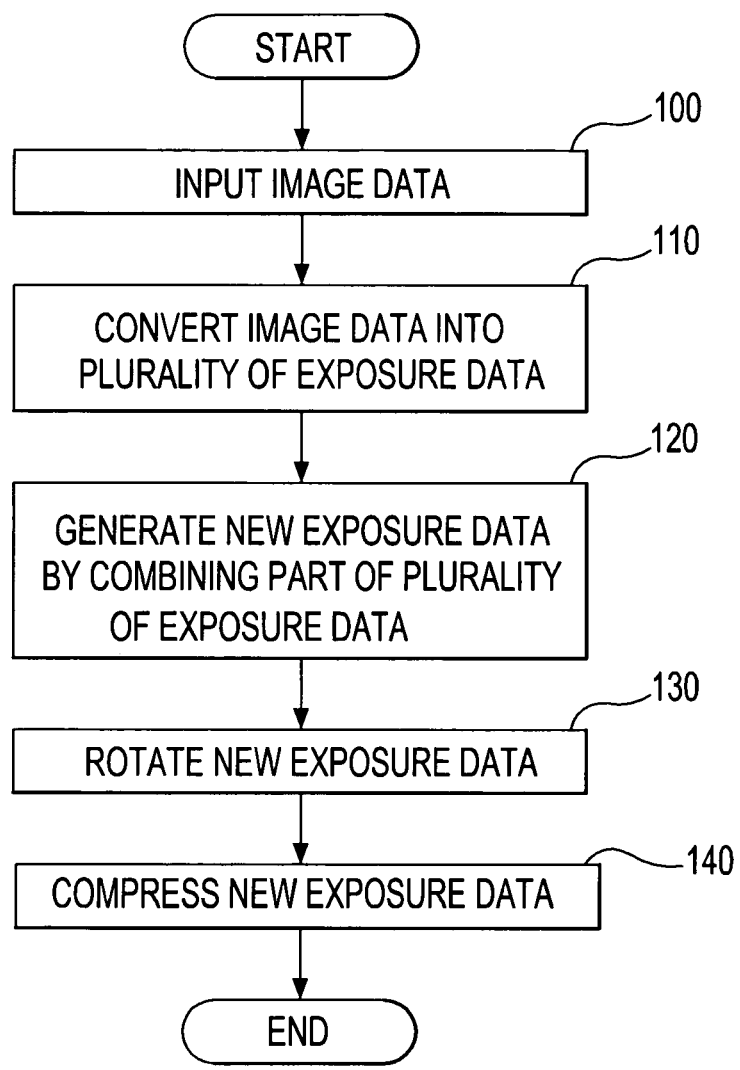

EXPOSURE APPARATUSES AND METHODS TO COMPRESS EXPOSURE DATA

CROSS-REFERENCE TO RELATED APPLICATION(S)

This application claims priority from Korean Patent Application No. 10-2008-0109624, filed on Nov. 6, 2008, in the Korean Intellectual Property Office (KIPO), the entire contents of which are incorporated herein by reference.

BACKGROUND

1. Field

Example embodiments relate to exposure apparatuses and/or methods to compress exposure data. Also, example embodiments relate to exposure apparatuses that compress exposure data and/or methods to compress the exposure data.

2. Description of the Related Art

There may be a variety of generally-known exposure apparatuses to form 2-dimensional (2D) images on an exposed surface on a basis of exposure.

For example, a certain exposure apparatus may perform light exposure by modulating a light beam using a spatial optical modulation element, such as a digital micro-mirror device (DMD), in accordance with exposure data.

The DMD may be configured by arranging a plurality of micro-mirrors on a 2D plane to be allocated to a plurality of memory cells formed on a semiconductor substrate, for example, made of silicon. According to the exposure data, tilting angles of reflection surfaces of the respective micro-mirrors may be varied by electrostatic forces of electric charges accumulated in respective memory cells. Exposure points may be formed at desired positions on the exposed surface according to variations of tilting angles of the reflection surfaces.

When performing the light exposure using such an exposure apparatus, it may be required to generate exposure data, that is, information regarding on/off states of respective micro-mirrors.

However, when an exposure area is large and/or when resolution of the exposure image is high, a quantity of the exposure data accordingly may become great, thereby deteriorating a transmission rate of the exposure data.

In addition or in the alternative, when the exposure data is compressed using a general compression algorithm, the compression efficiency of the exposure data may be deteriorated. Therefore, it may take a long time to release the compression. This long time may hinder real-time transmission of the exposure data.

SUMMARY

Example embodiments may provide methods to compress exposure data that compress the exposure data after rearranging the exposure data.

Example embodiments also may provide apparatuses that may compress exposure data.

According to example embodiments, methods to compress exposure data may comprise converting an image data into a plurality of exposure data, generating a new exposure data by combining part of the plurality of exposure data, and/or compressing the new exposure data.

The exposure data compression methods may further comprise rotating the new exposure data by an angle (that may or may not be predetermined).

The angle (that may or may not be predetermined) may be 90 degrees or 270 degrees.

The new exposure data may be generated by combining exposure data located on a same position among the plurality of exposure data. For example, the exposure data located on a same position may refer to the exposure data arranged on the same row and/or the same column.

The plurality of exposure data may be arranged in a temporal order.

According to example embodiments, methods to compress exposure data may comprise converting an image data into a plurality of exposure data, generating a new exposure data by excluding part of the plurality of exposure data, and/or compressing the new exposure data.

The exposure data compression methods may further comprise calculating the number of available micro-mirrors by controlling a rotation angle of a digital micro-mirror device and/or generating a new exposure data by excluding the exposure data not corresponding to the available micro-mirrors.

The number of the available micro-mirrors may be calculated through an equation below:

$$K = N*(\tan \theta) \qquad \text{[Equation 1]}$$

wherein, K denotes the repeated number of the exposure operations, N denotes the number of available micro-mirrors located on a Y-axis, $\theta$ denotes the rotation angle of the DMD, and $\tan \theta$ denotes the tangent function of the rotation angle $\theta$.

According to example embodiments, an exposure apparatus may comprise a conversion unit converting an image data into a plurality of exposure data, a control unit generating a new exposure data by combining part of the plurality of exposure data, and/or a compression unit compressing the new exposure data.

The control unit may rotate the new exposure data by an angle (that may or may not be predetermined).

The control unit may exclude part of the plurality of exposure data before generation of the new exposure data.

The control unit may calculate the number of available micro-mirrors by controlling a rotation angle of a digital micro-mirror device and/or may exclude the exposure data not corresponding to the available micro-mirrors from objects of the exposure.

According to example embodiments, methods to compress exposure data may include converting image data into a plurality of exposure data, generating new exposure data by combining part of the plurality of exposure data and/or by excluding part of the plurality of exposure data, and/or compressing the new exposure data.

According to example embodiments, an exposure apparatus may include a conversion unit that converts image data into a plurality of exposure data, a control unit that generates new exposure data by combining part of the plurality of exposure data and/or by excluding part of the plurality of exposure data, and/or a compression unit that compresses the new exposure data.

BRIEF DESCRIPTION OF THE DRAWINGS

The above and/or other aspects and advantages will become more apparent and more readily appreciated from the following detailed description of example embodiments, taken in conjunction with the accompanying drawings, in which:

FIG. 9 is an operational flowchart illustrating processes of compressing exposure data according to example embodiments.

DETAILED DESCRIPTION

Figure 1:
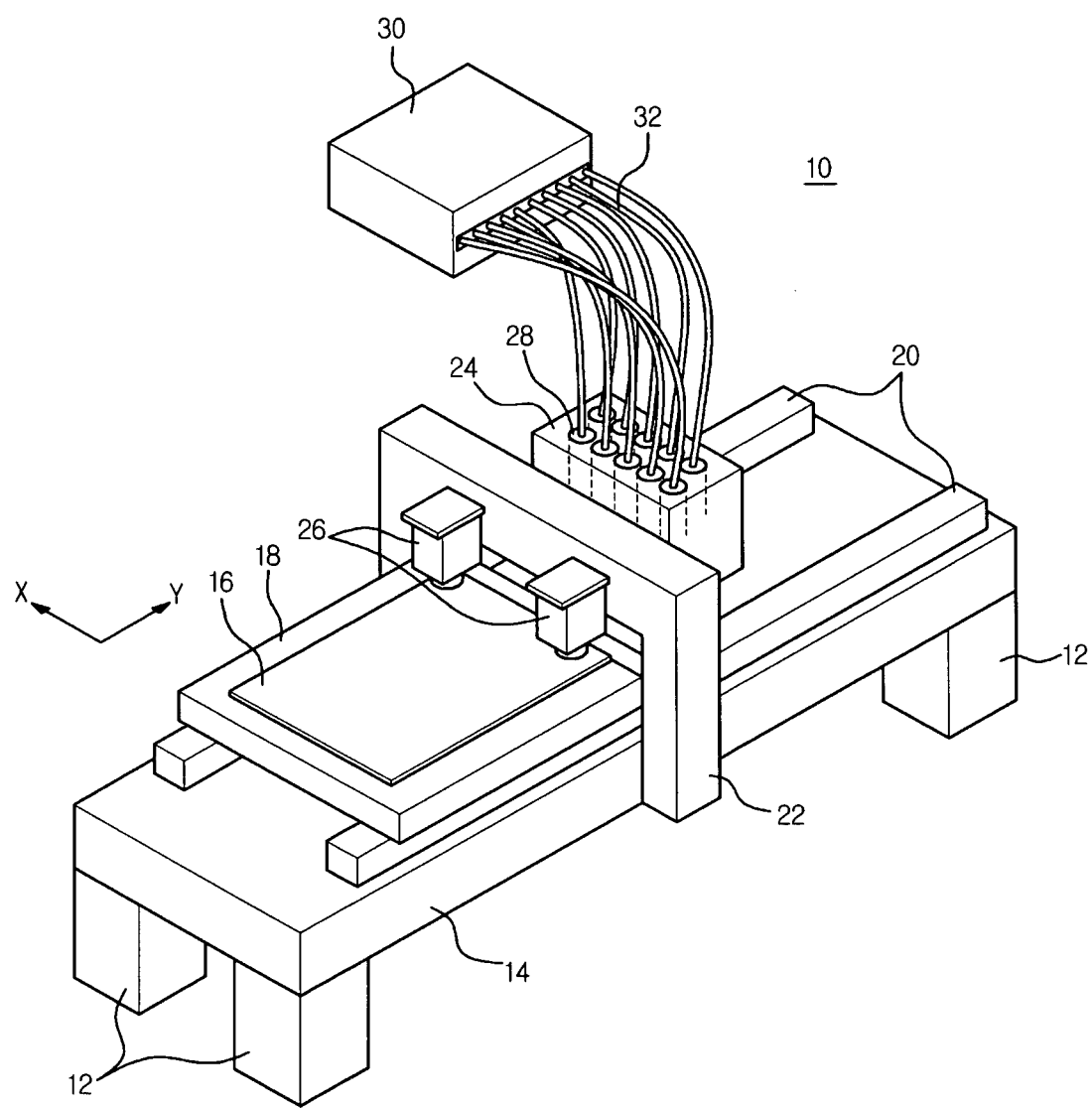
FIG. 1 is a perspective view schematically showing a structure of an exposure apparatus according to example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions are exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when an element is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

FIG. 1 is a perspective view schematically showing a structure of an exposure apparatus according to example embodiments.

Referring to FIG. 1, exposure apparatus 10 may comprise mounting base 14, stage 18, and/or guides 20. Mounting base 14 may be in the form of a thick flat bed supported by supporting parts 12. There may be, for example, four supporting parts 12. Stage 18 may be mounted at an upper part of mounting base 14 in order to scan one or more objects of exposure. The one or more objects of exposure may include substrate 16. The scanning may occur while moving substrate 16 in a Y-axis direction. Guides 20 may be mounted to an upper surface of mounting base 14. Guides 20 may extend along a moving direction of stage 18. There may be, for example, two guides 20. Stage 18 may be longitudinally extended along a Y-axis direction. Stage 18 may be supported by guides 20 in order to be movable in a reciprocating motion.

Gate 22 may be disposed on mounting base 14, near a middle of mounting base 14. Gate 22 may have, for example, a flattened-U shape and/or may be mounted to cross over a moving path of stage 18. Ends of gate 22 may be fixed to lateral sides of mounting base 14. Optical unit 24 may be provided on one side of mounting base 14 and/or may be mounted on gate 22. A plurality of measuring units 26 may be provided on one side of mounting base 14 and/or may be mounted on gate 22. There may be, for example, two measuring units 26.

While substrate 16 is moving, optical unit 24 may generate beams to be projected to substrate 16, while measuring units 26 may measure the beams projected to the substrate 16. Optical unit 24 and/or measuring units 26 may be attached to gate 22. In addition or in the alternative, optical unit 24 and/or measuring units 26 may be fixedly disposed at an upper side of a moving path of stage 18. for example, on opposite sides of gate 22.

Optical unit 24 may include a plurality of exposure heads 28. Exposure heads 28 may spatially modulate a laser beam projected from light source 30. Exposure heads 28 also may project the modulated laser beam as an exposure beam to substrate 16. Substrate 16 may have exposed surface 17 (see FIG. 3). Respective exposure heads 28 may be connected to optical fibers 32 drawn out from light source 30.

Light source 30 may comprise a semiconductor laser and/or an optical system that controls a laser beam projected by the semiconductor laser. Light source 30 may supply the laser beam to an incidence side of each exposure head 28 of optical unit 24.

Figure 2:
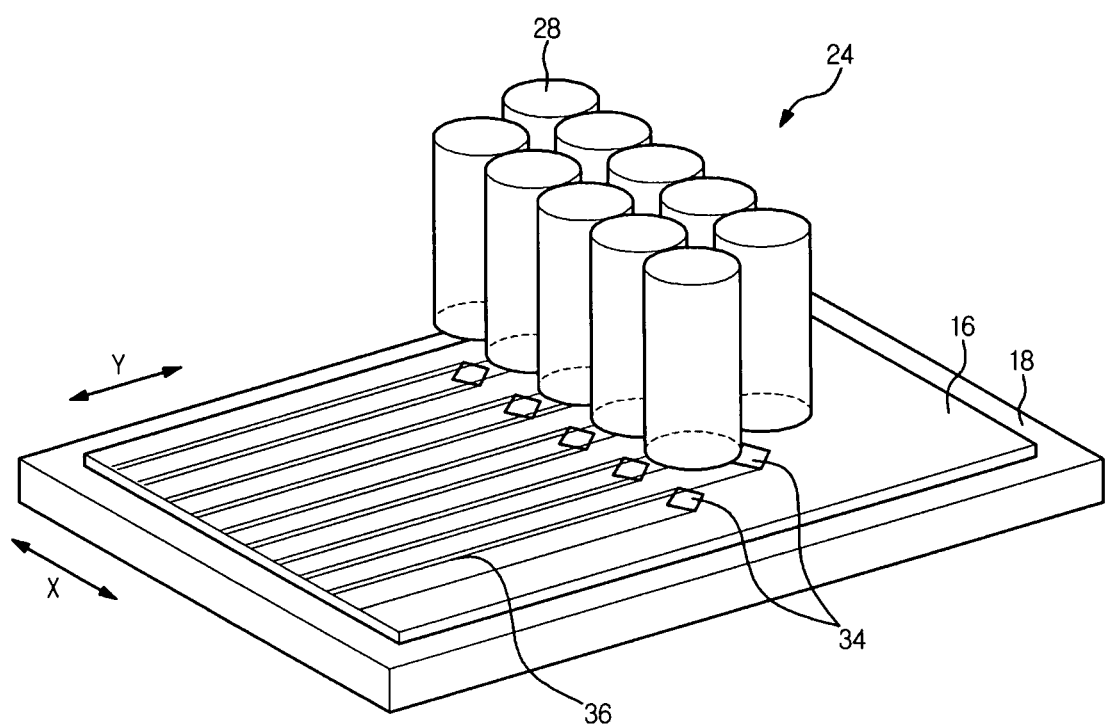
FIG. 2 is a perspective view showing a structure of an optical unit of the exposure apparatus according to example embodiments.

FIG. 2 is a perspective view showing a structure of an optical unit of the exposure apparatus according to example embodiments.

Referring to FIG. 2, optical unit 24 may include the plurality of exposure heads 28 arranged, for example, in a matrix form of m-number rows by n-number columns (e.g., 2 rows by 5 columns).

Exposure area 34, scanned by exposure head 28, may be formed in a rectangular shape that may have shorter sides in a scanning direction. As stage 18 moves, exposure completed area 36 for each exposure head 28 may be formed on substrate 16, for example, in a band form.

In addition or in the alternative, respective rows of exposure heads 28 may be alternately arranged. For example, exposure heads 28 may be deviated from one another by a distance (that may or may not be predetermined) so that exposure completed areas 36 (e.g., in the band form perpendicular to a scanning direction) may be formed without gaps between exposure completed areas 36. For instance, there may be unexposed areas between respective adjoining exposure areas 34 of the first row. According to the above arrangement, however, the unexposed areas of the first row may be exposed by exposure areas 34 of the second row.

Figure 3:
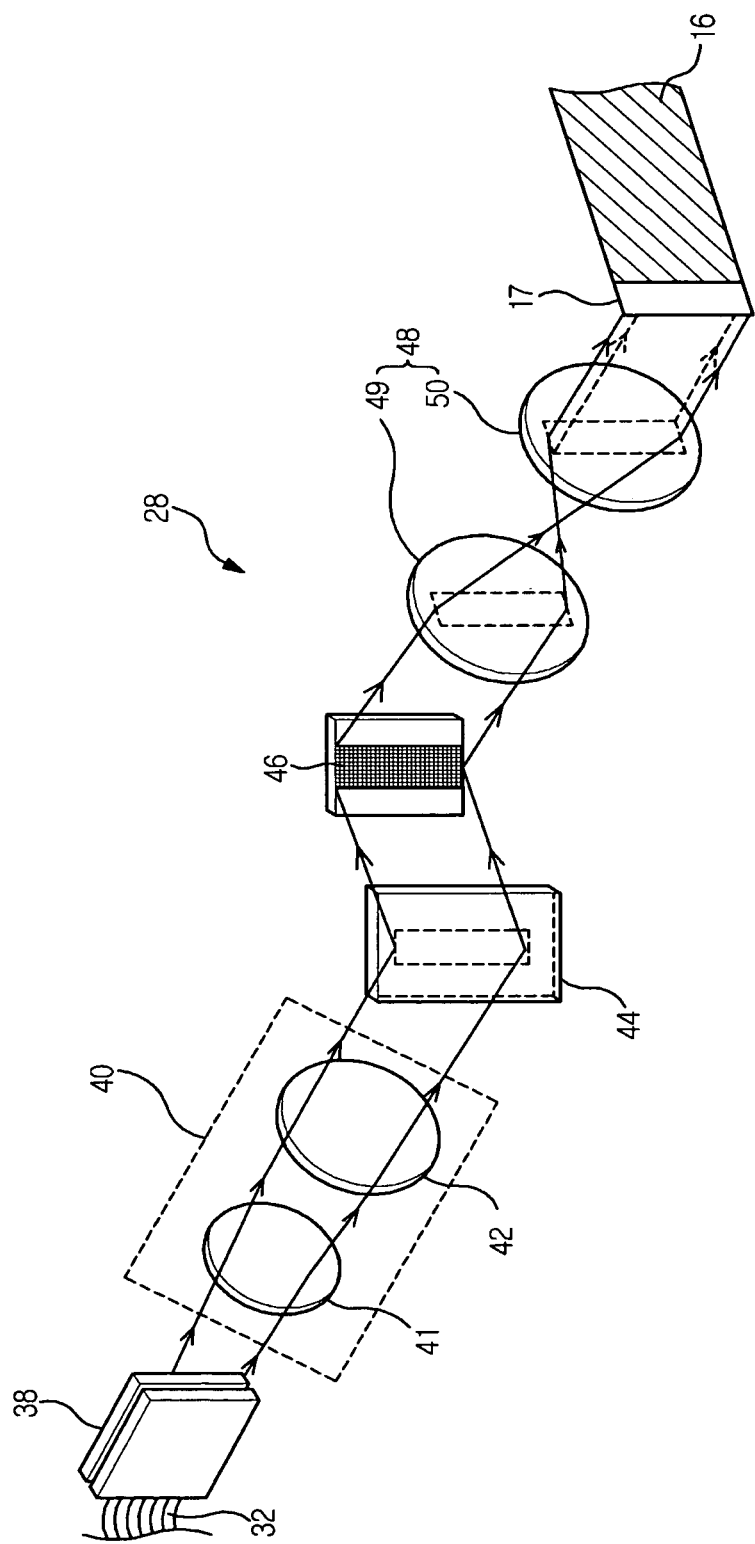
FIG. 3 is a perspective view schematically showing a structure of an exposure head of the exposure apparatus according to example embodiments.

FIG. 3 is a perspective view schematically showing a structure of an exposure head of the exposure apparatus according to example embodiments.

As shown in FIG. 3, exposure heads 28 may comprise compensation lens system 40. Compensation lens system 40 may compensate for the light projected from light output end 38 of optical fiber 32. Compensation lens system 40 may project the compensated light to mirror 44. Mirror 44 may reflect the light projected from compensation lens system 40 to digital micro-mirror device (DMD) 46. DMD 46 may partially modulate a reflection angle of the light reflected from mirror 44 such that the projected light may have patterns (that may or may not be predetermined). Exposure heads 28 may further comprise condensing lens system 48. Condensing lens system 48 may focus the light modulated by DMD 46, thereby forming an image on exposed surface 17 of substrate 16.

Compensation lens system 40 may comprise first compensation lens 41 and/or second compensation lens 42. First compensation lens 41 may even the light projected from light output end 38. Second compensation lens 42 may focus the light passed through first compensation lens 41 on mirror 44. Accordingly, the light projected from light output end 38 may be incident to mirror 44 as being uniformly distributed.

Mirror 44 may have a reflection surface on one side in order to reflect the beam passed through compensation lens system 44 to DMD 46.

DMD 46 may function as a spatial optical modulation element that may modulate the incident beams per pixel according to desired patterns. For example, DMD 46 may include plurality of micro-mirrors 45 (see FIG. 4) of which tilting angles of the reflection surfaces may be varied in accordance with control signals. In example embodiments, micro-mirrors 45 may be arranged on a 2D plane of a silicon semiconductor substrate with L-number rows by M-number columns. As DMD 46 performs scanning in a certain direction along exposed surface 17, the light having patterns (that may or may not be predetermined) may be reflected to condensing lens system 48.

In condensing lens system 48, comprising first condensing lens 49 and/or second condensing lens 50, a condensed position of the pattern beams passed through condensing lens system 48 may be controlled, for example, by adjusting a distance between first condensing lens 49 and second condensing lens 50. Therefore, the light beams modulated by DMD 46 may be incident to exposed surface 17 of substrate 16, accordingly curing or softening a photoconductive material formed at exposed surface 17 of substrate 16.

Figure 4:
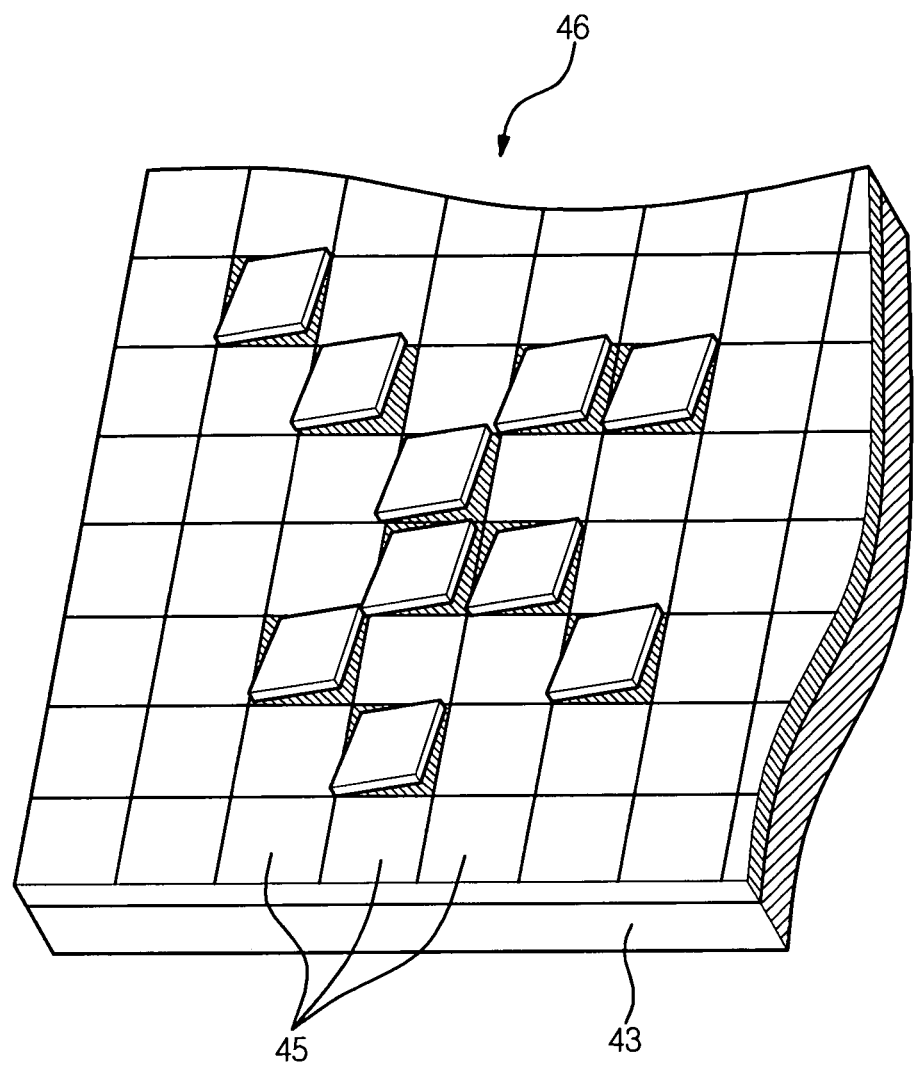
FIG. 4 is an enlarged perspective view showing a structure of a digital micro-mirror device (DMD) of the exposure apparatus according to example embodiments.

FIG. 4 is an enlarged perspective view showing a structure of a digital micro-mirror device (DMD) of the exposure apparatus according to example embodiments.

Referring to FIG. 4, DMD 46 may be a mirror device wherein plurality of micro-mirrors 45 constituting pixels may be arranged in a lattice form on memory cell 43. A high-reflectivity material, such as Aluminum (Al) may be, for example, vapor-deposited on surfaces of micro-mirrors 45.

When digital signals are recorded to memory cell 43, micro-mirrors 45 corresponding to the digital signals may be tilted by an angle (that may or may not be predetermined), for example, 12 degrees, with respect to substrate 16 where DMD 46 is placed. The tilt may be, for example, in a diagonal direction of respective micro-mirrors 45. On and off states of respective micro-mirrors 45 may be controlled by a control unit (not shown), as will be explained later. The beams reflected by micro-mirrors 45 in the on state may be modulated to an exposure mode, so as to be projected to exposed surface 17 through condensing lens system 48. On the other hand, the beams reflected by micro-mirrors 45 in the off state may be modulated to a non-exposure mode, so that the beams are not projected to exposed surface 17.

In addition, DMD 46 may be a bit slanted so that a shorter side of DMD 46 may form an angle (that may or may not be predetermined) with respect to the scanning direction.

Figure 5A:
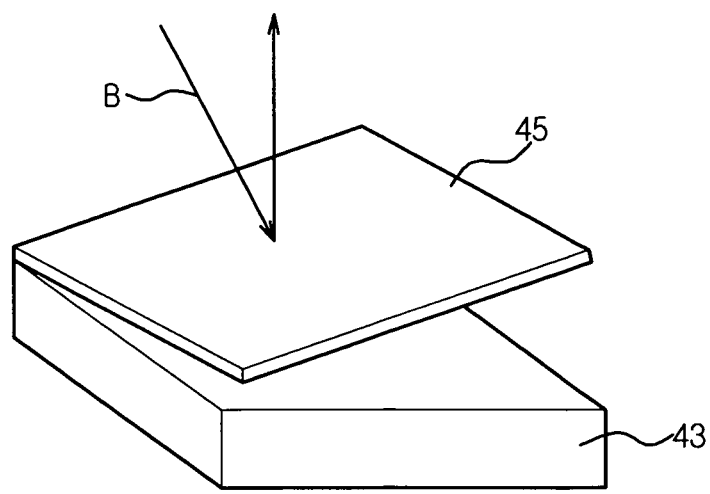
FIG. 5A and FIG. 5B illustrate example operations of the DMD of the exposure apparatus according to example embodiments.
Figure 5B:
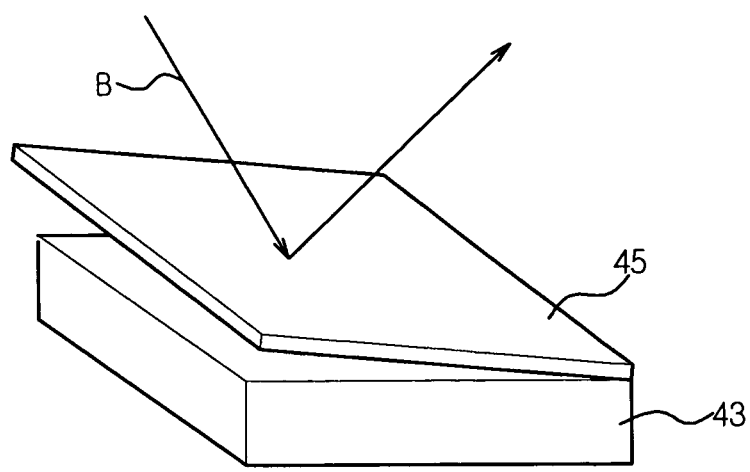

FIG. 5A and FIG. 5B illustrate example operations of the DMD of the exposure apparatus according to example embodiments.

FIG. 5A shows on-state micro-mirror 45 slanted by an angle (that may or may not be predetermined), for example, +12 degrees, while FIG. 5B shows off-state micro-mirror 45 slanted by an angle (that may or may not be predetermined), for example, −12 degrees. Thus, the slanted angles of micro-mirrors 45 in the pixels of DMD 46 may be controlled by control signals from a control unit (not shown), thereby reflecting beams B incident to DMD 46 according to the slanted directions of respective micro-mirrors 45.

Figure 6:
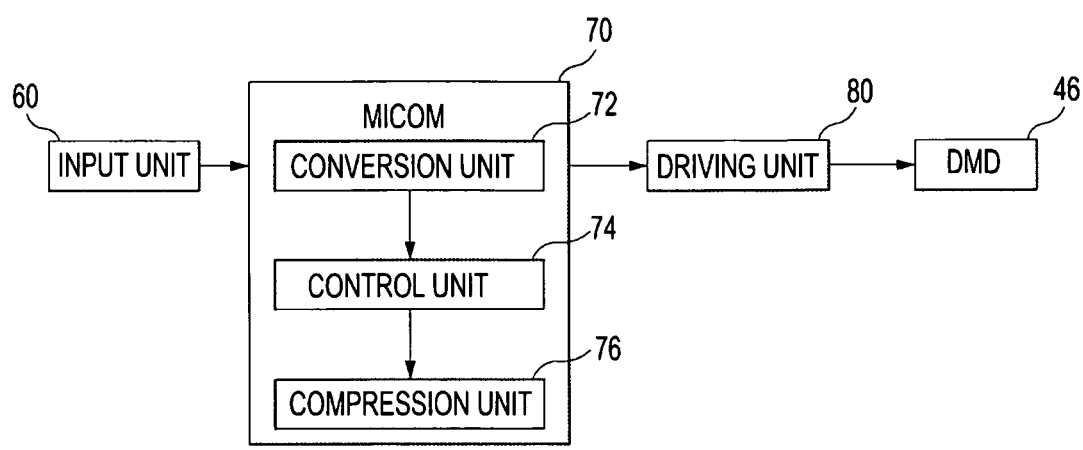
FIG. 6 is a control structure diagram of the exposure apparatus according to example embodiments.

FIG. 6 is a control structure diagram of the exposure apparatus according to example embodiments. FIG. 7A through FIG. 7E are views illustrating processes of newly generated exposure data according to example embodiments.

Referring to FIG. 6, exposure apparatus 10 may comprise input unit 60, micom 70, and/or driving unit 80.

Through input unit 60, image data generated by converting a 2D image into a bitmap form may be input to micom 70.

Micom 70, as a controller that may control overall operations of exposure apparatus 10, may comprises conversion unit 72, control unit 74, and/or compression unit 76.

Figure 7A:
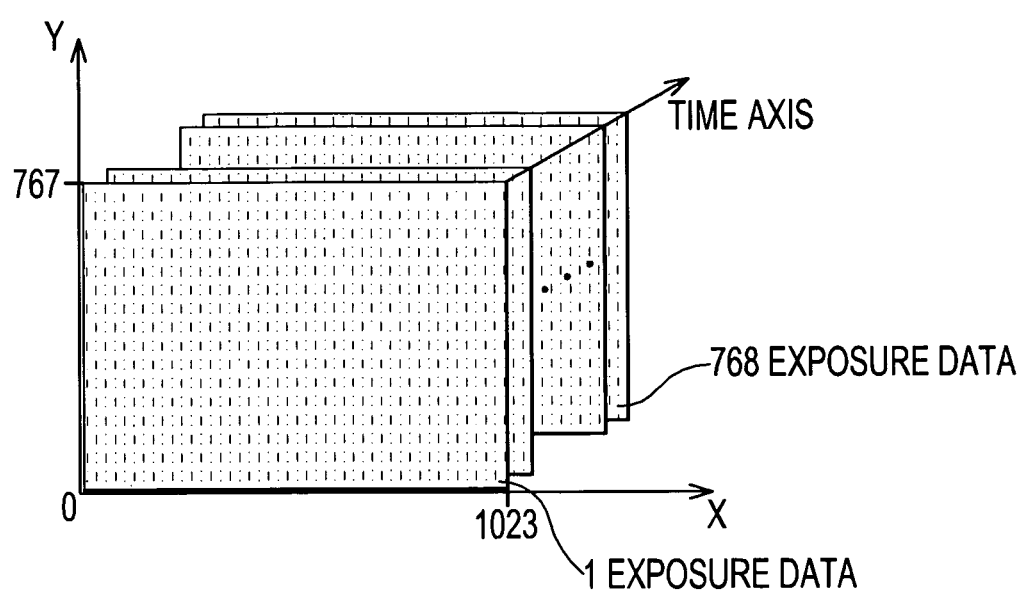
FIG. 7A through FIG. 7E are views illustrating processes of newly generated exposure data according to example embodiments.

As shown in FIG. 7A, conversion unit 72 may convert the image data into a plurality of exposure data, that is, a first exposure data to a $768^{th}$ exposure data arranged, for example, in temporal order.

The reason for converting the image data to the plurality of exposure data is that it may be impossible to form an image with only one exposure data. That is, in order to form an image, it may be necessary to combine the plurality of exposure data arranged, for example, in the temporal order.

According to example embodiments, control unit 74 may generate new exposure data by combining some of the plurality of exposure data. For example, control unit 74 may combine some of the exposure data, that may be arranged at a same position, that is, arranged at a same row or a same column, thereby generating the new exposure data.

Figure 7B:
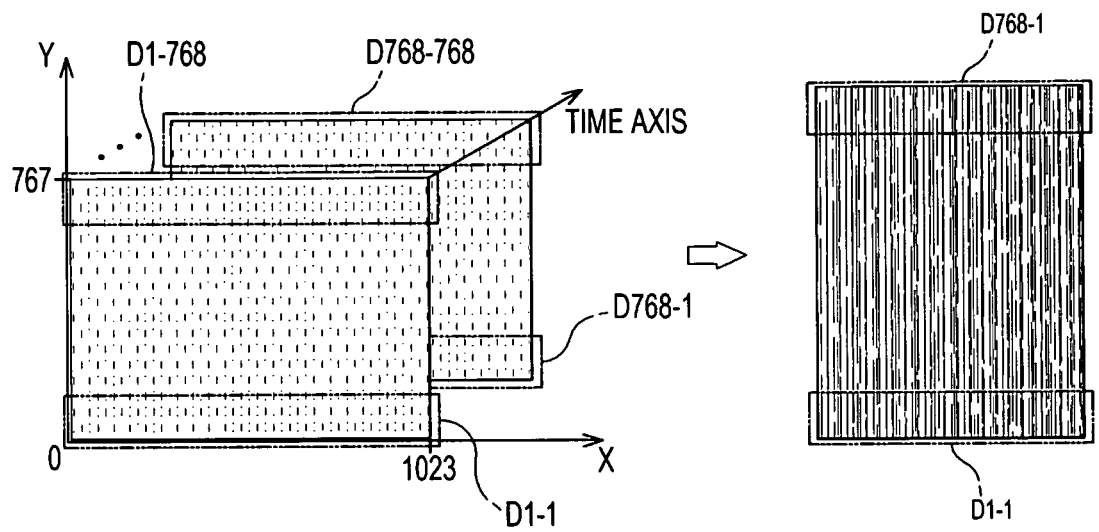
Figure 7C:
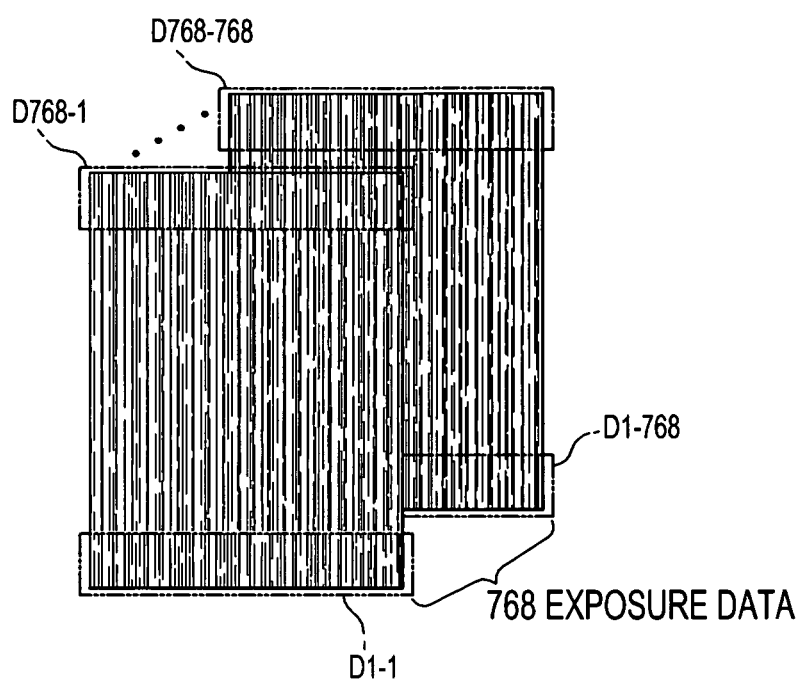

Referring to FIG. 7B, control unit 74 may extract exposure data D1-1 to D768-1, that may be located at positions X=0 to 1023 and Y=0, among temporally arranged 768 exposure data, and/or may combine the extracted exposure data, thereby generating one new exposure data. As such processes may be repeated from Y=0 to Y=767, totally 768 new exposure data may be generated, as shown in FIG. 7C.

Control unit 74 may rotate the new exposure data by an angle (that may or may not be predetermined). For example, control unit 74 may rotate the new exposure data by 90 degrees or 270 degrees, according to example embodiments.

Figure 7D:
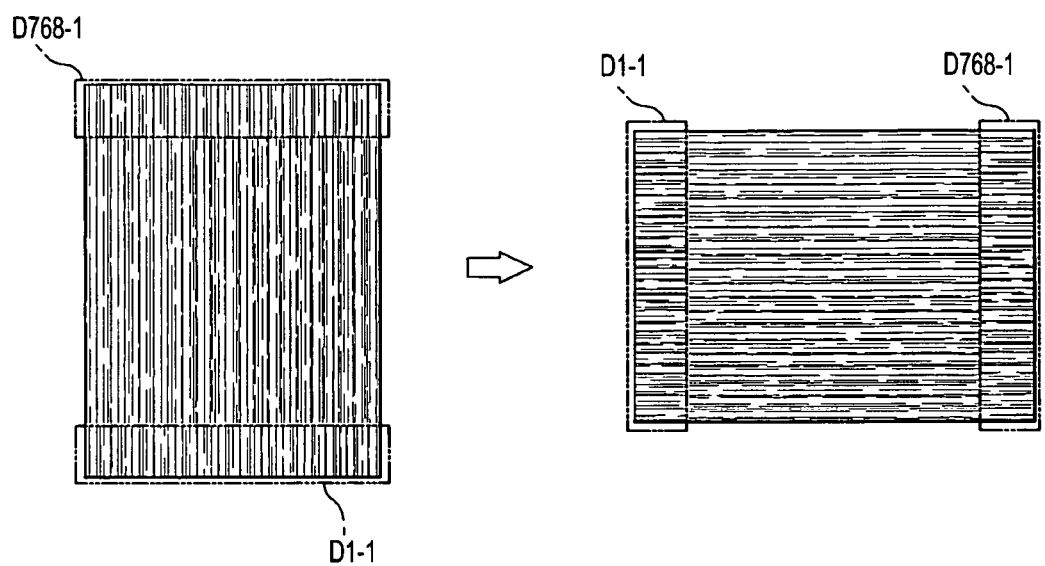

In FIG. 7D, control unit 74 may transpose the new exposure data with respect to an X-axis and a time axis. By thus rotating the new exposure data by the angle (that may or may not be predetermined), compression of data may be achieved using a compression method that may reduce redundant codes with respect to the rotated exposure data. In other words, when there exists successive information regarding the rotated exposure data, that successive information may be compressed into one, thus achieving data compression.

Figure 7E:
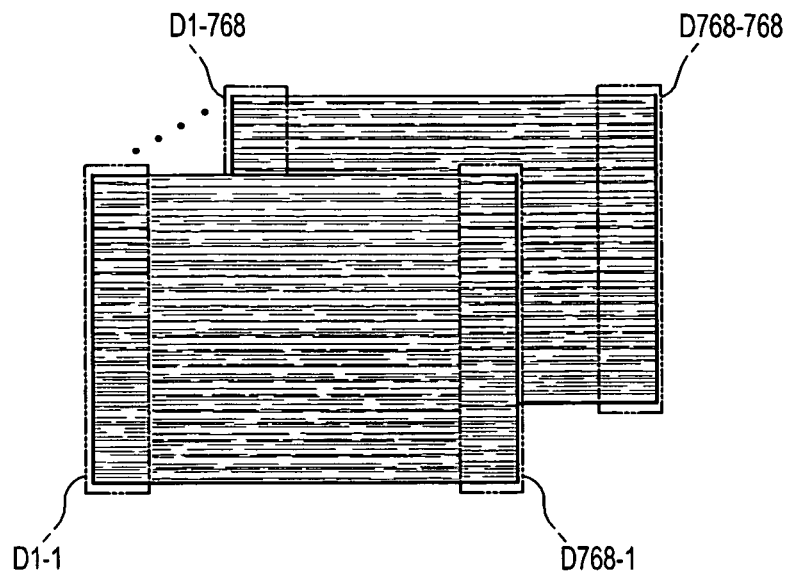

As shown in FIG. 7E, control unit 74 may generate 768 exposure data by repeatedly performing the rotation of the new exposure data with respect to all of the 768 exposure data.

Compression unit 76 may compress the exposure data rotated by the angle (that may or may not be predetermined).

When the exposure data is compressed by compression unit 76 (for example, by a compression algorithm such as Lempel-Ziv-Welch (LZW) algorithm), the compression efficiency may be improved since redundant data may be increased in a scanning direction, that is, from left to right in FIG. 7E. Therefore, an index may be reduced. For example, the exposure data 000011110010101010010010101001 located on the left, the exposure data before rotation of the new exposure data by the angle (that may or may not be predetermined), may be converted to the exposure data 1111111111111111100000111111111111 located on the right, after the rotation of the new exposure data by the angle (that may or may not be predetermined). Thus, the compression efficiency may be increased.

Figure 8A:
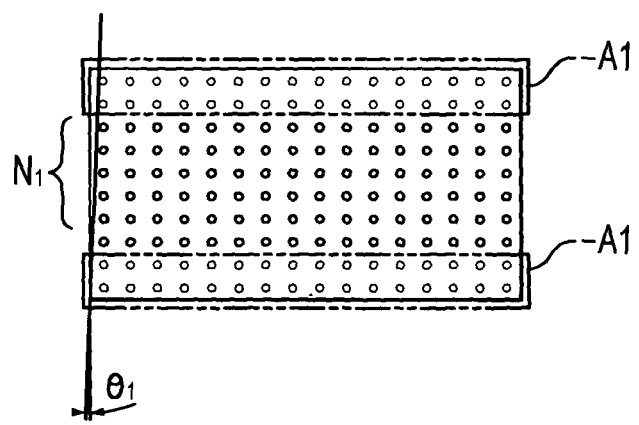
FIG. 8A and FIG. 8B illustrate exposure data newly generated according to example embodiments.
Figure 8B:
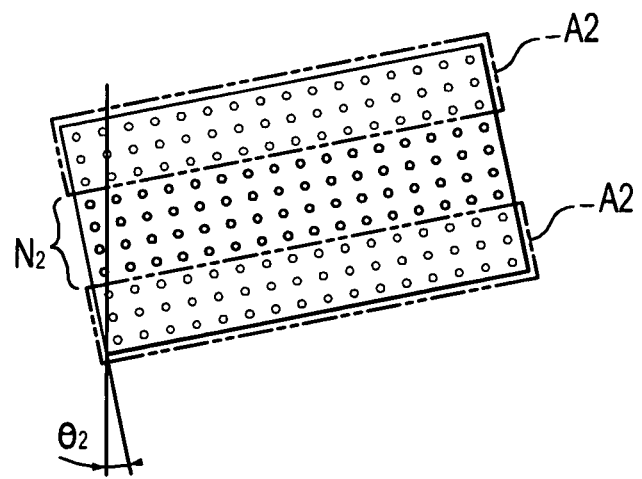

FIG. 8A and FIG. 8B illustrate exposure data newly generated according to example embodiments.

According to example embodiments, control unit 74 may generate new exposure data by excluding part of the plurality of exposure data.

For example, referring to FIG. 8A and FIG. 8B, control unit 74 may calculate number N of available micro-mirrors 45 by controlling a rotation angle of DMD 46. Here, number N of available micro-mirrors 45 may mean the number of micro-mirrors 45 located on a Y-axis.

For example, a shorter side of DMD 46 may be a bit slanted with respect to the scanning direction by an angle (that may or may not be predetermined). Therefore, when DMD 46 scans exposed surface 17, exposure operations may be repeatedly performed with respect to a position (that may or may not be predetermined). Thus, number N of available micro-mirrors 45 may be calculated by controlling the rotation angle of DMD 46.

More particularly, control unit 74 may calculate the number of available micro-mirror 45 using [Equation 1] as follows. By controlling the rotation angle of DMD 46 with value K that may be constantly fixed, the number of available micro-mirrors 45 may be calculated.

$$K=N^*(\tan \theta)$$ [Equation 1]

wherein K denotes a repeated number of exposure operations, N denotes the number of available micro-mirrors 45 located on the Y-axis, θ denotes the rotation angle of DMD 46, and tan θ denotes the tangent function of rotation angle θ.

After calculating the number of available micro-mirrors 45, control unit 74 may generate new exposure data by excluding the exposure data corresponding to the number of other micro-mirrors 45 except available micro-mirrors 45.

For example, control unit 74 may mask the exposure data corresponding to other micro-mirrors 45, (e.g., area A1, area A2) to zero. The masking of the exposure data to zero may mean that a value of the information on micro-mirrors 45 is converted to zero.

In FIG. 8A, when the rotation angle of DMD 46 is $\theta_1$, number $N_1$ of the available exposure data areas may be 6, while the number of area A1 corresponding to the other exposure data may be 2. Areas A1 not corresponding to the available exposure data may be masked to zero. In FIG. 8B, when the rotation angle is $\theta_2$, the number of available micro-mirrors 45, that is, number $N_2$ of available exposure data areas may be 4, whereas the number of other areas A2 may be 3. Therefore, areas A1 not corresponding to the available exposure data may be masked to zero.

Thus, since the masked area of the exposure data may be increased and/or decreased corresponding to increase and/or decrease of the rotation angle of DMD 46, the masked area not in use may be masked to zero by controlling the masked area of the exposure data. Accordingly, the whole exposure data may be reduced, thereby improving the compression efficiency.

Here, although the exposure quality may be deteriorated when increasing the masked area to improve the compression efficiency of the exposure data, such a problem may be compensated for by adjusting magnification of condensing lens system 48 and/or power of the laser.

For example, control unit 74 may be capable of adjusting the magnification of condensing lens system 48 by a parameter that may control the exposure data. When the magnification of condensing lens system 48 is decreased, intervals between the respective exposure points of micro-mirrors 45 may be reduced, thereby reducing size of the whole exposure data. Accordingly, the compression efficiency may be improved.

Meanwhile, control unit 74 may compress the exposure data by compositely using a method of generating a new exposure data through partial combination of the exposure data and/or a method of generating a new exposure data through partial exclusion of the exposure data.

For example, control unit 74 may generate a first new exposure data by excluding part of the exposure data and then may combine part of the first new exposure data, thereby generating a second new exposure data. As the second exposure data is compressed, the Y-axis of the exposure data may be reduced and/or the exposure data may be arranged in a linear form with respect to the X-axis. Therefore, the exposure data may be further reduced. Thus, the compression efficiency may be improved.

Driving unit 80 may turn on and off DMD 46 according to control signals from micom 70 so that the beam having the desired pattern may be projected to exposed surface 17.

Hereinafter, example processes of compressing the exposure data will be explained.

FIG. 9 is an operational flowchart explaining processes of compressing exposure data according to example embodiments. Referring to FIG. 9, the image data may be input to micom 70 through input unit 60 (operation 100).

Conversion unit 72 of micom 70 may convert the image data into the plurality of exposure data (operation 110) and/or may transmit the exposure data to control unit 74.

Control unit 74 may generate a new exposure data by combining part of the plurality of exposure data (operation 120).

For example, control unit 74 may generate the new exposure data by combining some exposure data arranged on a same row or a same column among the plurality of exposure data.

Control unit 74 may rotate the new exposure data by an angle (that may or may not be predetermined) (operation 130).

Compression unit 76 may compresses the exposure data (operation 140).

Figure 10:
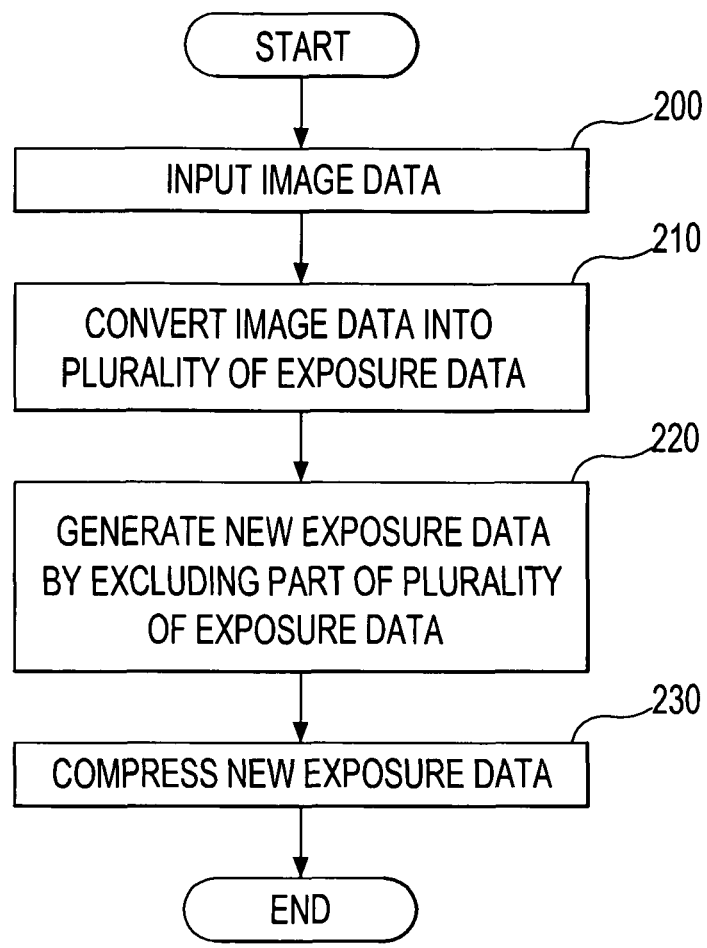
FIG. 10 is an operational flowchart illustrating processes of compressing exposure data according to example embodiments.

FIG. 10 is an operational flowchart illustrating processes of compressing exposure data according to example embodiments.

As shown in FIG. 10, the image data may be input to micom 70 through input unit 60 (operation 200).

Conversion unit 72 of micom 70 may convert the image data to a plurality of exposure data (operation 210) and/or may transmit the exposure data to control unit 74.

Control unit 74 may generate a new exposure data by excluding part of the plurality of exposure data (operation 220).

For example, control unit 74 may calculate the number of available micro-mirrors 45 by controlling the rotation angle of DMD 46, and/or may generate the new exposure data by excluding the exposure data not corresponding to available micro-mirrors 45.

The number of the available micro-mirrors 45 may be calculated using [Equation 1] below:

$$K = N^*(\tan \theta) \qquad [\text{Equation 1}]$$

wherein K denotes a repeated number of exposure operations, N denotes the number of available micro-mirrors 45 located on the Y-axis, θ denotes the rotation angle of DMD 46, and tan θ denotes the tangent function of rotation angle θ.

Compression unit 76 may compress the newly generated exposure data (operation 230).

As described above, the exposure apparatuses and/or the methods to compress the exposure data according to example embodiments may be capable of improving the compression efficiency for the exposure data, without deteriorating the exposure quality, by compressing the exposure data after generating new exposure data by combining part of a plurality of exposure data.

Accordingly, the exposure may be performed in real time.

Furthermore, when performing a digital exposure through the above compression method, time delay for replacement of masks and exposure time may be reduced compared to an analog exposure of a liquid crystal display (LCD), a semiconductor, and so on.

While example embodiments have been particularly shown and described, it will be understood by those of ordinary skill in the art that various changes in form and details may be made therein without departing from the spirit and scope of the present invention as defined by the following claims.

What is claimed is:

1. A method to compress exposure data, the method comprising:
converting, in a conversion unit, image data into a plurality of exposure data;
generating, in a control unit, new exposure data with improved compressing efficiency:
by combining part of the plurality of exposure data,
by excluding part of the plurality of exposure data, or
by combining part of the plurality of exposure data and by excluding part of the plurality of exposure data; and
compressing, in a compression unit, the new exposure data.

2. The method of claim 1, wherein the new exposure data is generated by combining part of the plurality of exposure data.

3. The method of claim 1, further comprising:
rotating the new exposure data by an angle.

4. The method of claim 3, wherein the angle is a predetermined angle.

5. The method of claim 3, wherein the angle is 90 or 270 degrees.

6. The method of claim 1, wherein the new exposure data is generated by combining exposure data located in a same position among the plurality of exposure data.

7. The method of claim 6, wherein the exposure data is located in the same position among the plurality of exposure data when the exposure data is arranged in a same row among the plurality of exposure data or in a same column among the plurality of exposure data.

8. The method of claim 1, wherein the plurality of exposure data is arranged in a temporal order.

9. The method of claim 1, wherein the new exposure data is generated by excluding part of the plurality of exposure data.

10. The method of claim 9, further comprising:
calculating a number of available micro-mirrors by controlling a rotation angle of a digital micro-mirror device.

11. The method of claim 10, further comprising:
generating the new exposure data by excluding exposure data not corresponding to the number of available micro-mirrors.

12. The method of claim 10, wherein the number of available micro-mirrors is calculated using the following equation:

$$K = N^*(\tan \theta)$$

wherein K denotes a repeated number of exposure operations,
wherein N denotes the number of available micro-mirrors located on a Y-axis,
wherein θ denotes the rotation angle of the digital micro-mirror device, and
wherein tan θ denotes the tangent function of the rotation angle θ.

13. An exposure apparatus, comprising:
a conversion unit that converts image data into a plurality of exposure data;
a control unit that generates new exposure data with improved compressing efficiency:
by combining part of the plurality of exposure data,
by excluding part of the plurality of exposure data, or
by combining part of the plurality of exposure data and by excluding part of the plurality of exposure data; and
a compression unit that compresses the new exposure data.

14. The exposure apparatus of claim 13, wherein the control unit rotates the new exposure data by an angle.

15. The exposure apparatus of claim 14, wherein the angle is a predetermined angle.

16. The exposure apparatus of claim 14, wherein the angle is 90 or 270 degrees.

17. The exposure apparatus of claim 13, wherein the control unit excludes part of the plurality of exposure data before generating the new exposure data.

18. The exposure apparatus of claim 17, wherein the control unit calculates a number of available micro-mirrors by controlling a rotation angle of a digital micro-mirror device.

19. The exposure apparatus of claim 18, wherein the control unit excludes the exposure data not corresponding to the number of available micro-mirrors from objects of the exposure.

20. The exposure apparatus of claim 18, wherein the number of available micro-mirrors is calculated using the following equation:

$$K = N * (\tan \theta)$$

wherein K denotes a repeated number of exposure operations, wherein N denotes the number of available micro-mirrors located on a Y-axis, wherein $\theta$ denotes the rotation angle of the digital micro-mirror device, and wherein $\tan \theta$ denotes the tangent function of the rotation angle $\theta$.

* * * * *